(12) United States Patent
Yang

(10) Patent No.: US 8,023,282 B2
(45) Date of Patent: Sep. 20, 2011

(54) HYBRID STRUCTURE OF MULTI-LAYER SUBSTRATES AND MANUFACTURE METHOD THEREOF

(75) Inventor: Chih-kuang Yang, Hsinchu (TW)

(73) Assignee: Princo Corp., Hsinchu (TW)

( * ) Notice: Subject to any disclaimer, the term of this patent is extended or adjusted under 35 U.S.C. 154(b) by 903 days.

(21) Appl. No.: 11/856,858

(22) Filed: Sep. 18, 2007

(65) Prior Publication Data

US 2008/0138575 A1 Jun. 12, 2008

(30) Foreign Application Priority Data

Dec. 6, 2006 (TW) .............................. 95145482 A

(51) Int. Cl.
*H01R 12/16* (2006.01)

(52) U.S. Cl. ........ 361/790; 361/749; 361/792; 361/795; 361/803; 174/250; 174/254; 174/258; 174/259; 428/137; 428/209; 29/825; 29/830; 438/107; 438/622

(58) Field of Classification Search .................. 361/790, 361/749, 792, 795, 803; 174/250, 245, 258, 174/259; 428/137, 209; 29/825, 830; 438/107, 438/622

See application file for complete search history.

(56) References Cited

U.S. PATENT DOCUMENTS

| | | | | |
|---|---|---|---|---|
| 5,374,469 A * | 12/1994 | Hino et al. | ..................... | 428/209 |
| 5,638,597 A * | 6/1997 | Cutting et al. | .................. | 29/830 |
| 6,055,722 A * | 5/2000 | Tighe et al. | ..................... | 29/843 |
| 6,064,415 A * | 5/2000 | Takizawa et al. | ............. | 347/200 |
| 6,201,302 B1 | 3/2001 | Tzu | | |
| 6,222,136 B1 * | 4/2001 | Appelt et al. | .................. | 174/254 |
| 6,294,731 B1 | 9/2001 | Lu et al. | | |
| 6,404,052 B1 | 6/2002 | Kurita et al. | | |
| 6,429,530 B1 | 8/2002 | Chen | | |
| 6,693,029 B2 * | 2/2004 | Iijima et al. | .................... | 438/622 |
| 6,966,784 B2 * | 11/2005 | Van Schuylenbergh et al. | ............................ | 439/67 |
| 7,286,370 B2 * | 10/2007 | Ooyabu | ......................... | 361/803 |
| 7,347,880 B2 * | 3/2008 | O'Phelan et al. | ............ | 29/25.03 |
| 7,532,456 B2 * | 5/2009 | Poplett | ........................... | 361/508 |
| 7,687,312 B2 * | 3/2010 | Yang | ............................. | 438/107 |
| 7,815,441 B2 * | 10/2010 | Kobayashi et al. | ............. | 439/67 |
| 2004/0035520 A1 * | 2/2004 | Nakamura et al. | ............. | 156/182 |
| 2004/0062019 A1 * | 4/2004 | Akama | ......................... | 361/792 |
| 2004/0194999 A1 * | 10/2004 | Tomita et al. | ................. | 174/250 |
| 2006/0107506 A1 * | 5/2006 | Doffing et al. | ................ | 29/25.03 |
| 2006/0219429 A1 * | 10/2006 | Ikumo et al. | .................... | 174/258 |
| 2008/0259575 A1 * | 10/2008 | Tanimura et al. | .............. | 361/749 |

FOREIGN PATENT DOCUMENTS

CN 1351815 A 5/2002

(Continued)

*Primary Examiner* — Xiaoliang Chen

(57) ABSTRACT

A hybrid structure of multi-layer substrates comprises a first multi-layer substrate and a second multi-layer substrate. The first multi-layer substrate stacks up first metal layers, first dielectric layers alternately and has VIAs. A border district of a first metal layer connects with a border district of the corresponding first dielectric layer. The border districts are separated from adjacent first metal layers and adjacent first dielectric layers. The second multi-layer substrate stacks up second metal layers and second dielectric layers alternately. A border district of a second metal layer connects with a border district of the corresponding second dielectric layer. The border districts are separated from adjacent second metal layers and adjacent second dielectric layers. The VIAs are located at the border districts of the first dielectric layers and each VIA has electric conductor therein to connect one first metal layer with one second metal layer.

15 Claims, 5 Drawing Sheets

FOREIGN PATENT DOCUMENTS

| | | |
|---|---|---|
| CN | 1186971 C | 1/2005 |
| CN | 1575094 A | 2/2005 |
| CN | 1652663 A | 8/2005 |
| CN | 1703136 A | 11/2005 |
| CN | 1231965 C | 12/2005 |
| CN | 1713802 A | 12/2005 |
| CN | 2786910 Y | 6/2006 |
| JP | 05-243741 A | 9/1993 |
| JP | 07-058431 A | 3/1995 |
| JP | 08-236937 A | 9/1996 |
| JP | 2002314257 A | 10/2002 |
| TW | 434664 | 5/2001 |
| TW | I226110 | 1/2005 |
| TW | I255488 | 5/2006 |

\* cited by examiner

HYBRID STRUCTURE OF MULTI-LAYER SUBSTRATES AND MANUFACTURE METHOD THEREOF

FIELD OF THE INVENTION

The present invention generally relates to a hybrid structure of multi-layer substrates and the manufacture method thereof, and more particularly to a hybrid structure of different kinds of multi-layer substrates and the manufacture method thereof which can be applied to different kinds of chip devices.

BACKGROUND OF THE INVENTION

Miniaturization for all electronic productions is an unavoidable trend in this modern world. While the scales of the semiconductor chips continuously get smaller, the scale of the related technology for packaging needs to be microminiaturized to follow the scale of the semiconductor chip is also unavoidable. Today, because the integration of integrated circuits has been greatly increased, using a multi-layer substrate to package different kinds of chip devices is necessary to integrate different kinds of functions to obtain a high performance integration system consequentially. For example, an integration system may comprise many kinds of chip devices, such as a logic circuit component, a memory, an analog component, an optoelectronic component, a microelectric mechanical component or a luminous component. Generally, the kinds of chip devices need to connect with each other through one shared package substrate (such as a mainboard) according to prior arts. That is, if one chip device can be connected to another chip device directly, the integration of package can be increased to microminiaturize the whole system further. A Stacked Chip Scale Package (SCSP) is proposed to package several chips nowadays, is called a 3D-package. However, such a 3D-package concept is limited in a rigid system package.

For meeting the variety of modern electronic production, a flexible multi-layer substrate or a non-flat substrate can be used for high density package. According to prior arts, the connection for two independent multi-layer substrates is established through connectors or through one shared package substrate. Therefore, for corresponding to a flexible or irregular package to increase integration complexity and reducing package volume, even applying for a System-In-Package, connection becomes a great topic and a challenge for the package technology today.

Therefore, development of a hybrid structure of multi-layer substrates and manufacture method thereof to connect different kinds of chip devices directly without a shared package substrate, this will reduce the package volume of the whole system to increase the package integration and to provide a flexible package. Accordingly, microminiaturization of whole system can be achieved.

SUMMARY OF THE INVENTION

An objective of the present invention is to provide a hybrid structure of multi-layer substrates and manufacture method thereof to connect different kinds of chip devices directly.

Another objective of the present invention is to provide a hybrid structure of multi-layer substrates and manufacture method thereof to reduce package volume of the whole system for increasing the package integration and provide a flexible package.

The hybrid structure of multi-layer substrates of the present invention comprises at least a first multi-layer substrate and a second multi-layer substrate. The first multi-layer substrate stacks up a plurality of first metal layers, a plurality of first dielectric layers alternately and has a plurality of VIAs. A border district of at least one first metal layer connects with a border district of the corresponding first dielectric layer of the first metal layer. The border districts are separated from adjacent first metal layers and adjacent first dielectric layers. The second multi-layer substrate stacks up a plurality of second metal layers and a plurality of second dielectric layers alternately. A border district of at least one second metal layer connects with a border district of the corresponding second dielectric layer of the second metal layer. The border districts are separated from adjacent second metal layers and adjacent second dielectric layers. The VIAs are located at the border districts of the first dielectric layers, and each VIA has electric conductor therein. The VIAs connects the first metal layer with the second metal layer to form a connection section.

After forming the first metal layers on the first dielectric layers, an interface adhesion enhancing process is implemented on rest surfaces of the first metal layers and the corresponding first dielectric layers to increase adhesion intensity on the rest surfaces. Alternatively, an interface adhesion weakening process is implemented on the border districts to decrease adhesion intensity thereon. The hybrid structure of multi-layer substrates according to the present invention may further comprise a first chip device positioned on a first outer surface of the first multi-layer substrate. The hybrid structure of multi-layer substrates may further comprise a second chip device positioned on a first outer surface of the second multi-layer substrate. An interface adhesion enhancing process is also implemented on the first chip device, the second chip device and respective corresponding first outer surfaces to increase adhesion intensity therebetween. The hybrid structure of multi-layer substrates may further comprise a third substrate to connect the first multi-layer substrate or the second multi-layer substrate. The third substrate can also be used to connect the first chip device or the second chip device. The first multi-layer substrate, the second multi-layer substrate and the third substrate all can be a flexible multi-layer interconnection substrate.

Moreover, the present invention also provides a manufacture method of a hybrid structure of multi-layer substrates for connecting chip devices. The manufacture method of the present invention comprises steps of:

separating a border district of at least one metal layer and the corresponding dielectric layer from adjacent metal layers and adjacent dielectric layers for each multi-layer substrate; and connecting electric conductor in a VIA of a first metal layer of one multi-layer substrate with a separated border district of a metal layer of another multi-layer substrate to form a connection section.

The manufacture method of the present invention comprises a step of forming the multi-layer substrates on the chip devices and a step of implementing an interface adhesion enhancing process on the chip devices during the step of forming the multi-layer substrates. The step of forming the multi-layer substrates further comprises steps of:

(A) coating a dielectric layer on the surfaces of the chip devices;

(B) forming a plurality of VIAs at the dielectric layer and a metal layer on the dielectric layer;

(C) coating another dielectric layer;

(D) repeating step (B) and step (C) to form the multi-layer substrates.

The manufacture method of the present invention may further comprise a step of implementing an interface adhesion enhancing process on rest surface of the metal layer and the corresponding dielectric layer except the border districts to increase adhesion intensity on the rest surfaces before coating the another dielectric layer during the step (C). Alternatively, the aforesaid step can be replaced by a step of implementing an interface adhesion weakening process on the border districts to decrease adhesion intensity thereon.

After the connecting step, the manufacture method of the present invention further comprises a step of connecting the multi-layer substrates or the chip devices with a third substrate.

According to the hybrid structure of the multi-layer substrates and manufacture method of the present invention, directly connecting different kinds of chip devices can be realized. Moreover, the present invention can reduce the package volume of the whole system for increasing the package integration and provide a flexible package for application of a flexible electronic system.

DETAILED DESCRIPTION OF THE INVENTION

Figure 1:
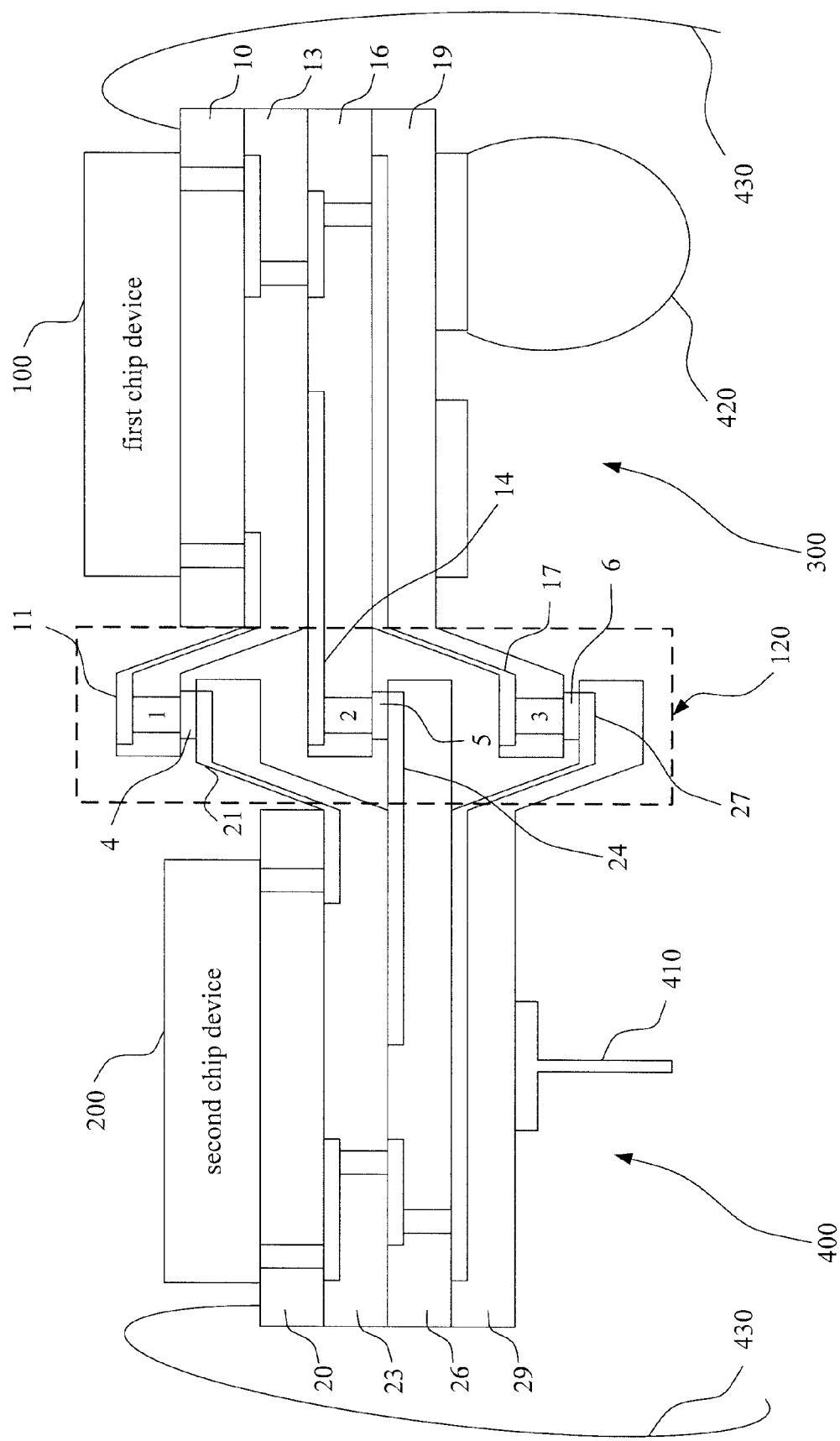
FIG. 1 illustrates a profile drawing of a hybrid structure of multi-layer substrates according to a first embodiment of the present invention.

Please refer to FIG. 1, which illustrates a profile drawing of a hybrid structure of multi-layer substrates according to a first embodiment of the present invention. The hybrid structure of multi-layer substrates comprises a first multi-layer substrate 300, a second multi-layer substrate 400 and VIAs 1, 2, 3 formed in the first multi-layer substrate 300. A first chip device 100 is positioned on a first outer surface of the first multi-layer substrate 300. A second chip device 200 is positioned on a first outer surface of the second multi-layer substrate 400. Either the first chip device 100 or the second chip device 200 can be a logic circuit component, a memory, an analog component, an optoelectronic component, a microelectric mechanic component, a luminous component or any other components. The hybrid structure of multi-layer substrates may further comprise a third substrate (not shown in Figures). The third substrate can be employed to connect the first multi-layer substrate 300 or the second multi-layer substrate 400 via a pin 410 or Ball Mount 420. Alternatively, the third substrate also can be employed to connect the first chip device 100 or the second chip device 200.

The first multi-layer substrate 300 comprises first dielectric layers 10, 13, 16, 19 and first metal layers 11, 14, 17. The second multi-layer substrate 400 comprises second dielectric layers 20, 23, 26, 29 and second metal layers 21, 24, 27. The first chip device 100 is connected with the first dielectric layer 10 of the first multi-layer substrate 300. The second chip device 200 is connected with the second dielectric layer 20.

As shown in FIG. 1, regarding the first multi-layer substrate 300, the border districts of the first metal layer 11 and the first dielectric layer 13 are connected therewith, the border districts of the first metal layer 14 and the first dielectric layer 16 connected therewith and the border districts of the first metal layer 17 and the first dielectric layer 19 connected therewith are separated from adjacent first metal layers and adjacent first dielectric layers. Similarly, regarding the second multi-layer substrate 400, the border districts of the second metal layer 21 and the second dielectric layer 23 are connected therewith, the border districts of the second metal layer 24 and the second dielectric layer 26 connected therewith and the border districts of the second metal layer 27 and the second dielectric layer 29 connected therewith are separated from adjacent second metal layers and adjacent second dielectric layers respectively. Besides, the VIAs 1, 2, 3 are located at the border districts of the first dielectric layers 13, 16, 19 respectively.

The VIAs 1, 2, 3 have electric conductors including electric conduction material therein. The electric conductors in the VIAs 1, 2, 3 can be formed when the first metal layers 11, 14, 17 are formed by using Lithography Etching, Electroplating or Metal Lift-off, that is, the VIAs 1, 2, 3 fill up with the electric conduction material when the first metal layers 11, 14, 17 are formed. Therefore, the electric conduction material is the same metal element of the first metal layers 11, 14, 17. However, the electric conductors are not limited to aforementioned but the process of forming the electric conductors can be independent of the process of forming the first metal layers 11, 14, 17. The electric conduction material in the VIAs 1, 2, 3 can be different from the metal element of the first metal layers 11, 14, 17 according to different demands. For example, the VIAs 1, 2, 3 can fill up with the electric conductors after separating the border districts of the first metal layers and the first dielectric layers connected therewith from adjacent first metal layers and adjacent first dielectric layers of the first multi-layer substrate 300.

The separated border districts of the second metal layers 21, 24, 27 of the second multi-layer substrate 400 are connected with the electric conductors in the VIAs 1, 2, 3 located at the border districts of the first dielectric layers 13, 16, 19 respectively when the second multi-layer substrate 400 is going to connect with the first multi-layer substrate 300 to form a connection section 120 of the hybrid structure of multi-layer substrates as shown in FIG. 1. The interconnection method of bonders 4, 5, 6 can use bondings such as tin finish bonding, Eutectic bonding, Anisotropic Conductive Film bonding, Gold-Gold bonding or Gold-Copper bonding. By such interconnection, the second metal layers 21, 24, 27 and the first metal layers 11, 14, 17 are interconnected and by such hybrid structure of multi-layer substrates, a direct interconnection of the first multi-layer substrate 300 and the second multi-layer substrate 400 can be realized. Comparing with prior arts, the direct interconnection of the first multi-layer substrate 300 and the second multi-layer substrate 400 is achieved by utilizing the separated border districts of the multi-layer substrates. Therefore, package integration can be increased and package volume of the whole system can be reduced and provide effectively a flexible package for application of a flexible electronic system.

In the first embodiment of the present invention, the VIAs 1, 2, 3 at the first dielectric layers 13, 16, 19 are connected with the second metal layers 21, 24, 27 one by one but the interconnection is not limited thereto. Selective interconnection or one by many can also be illustrated.

Figure 2:
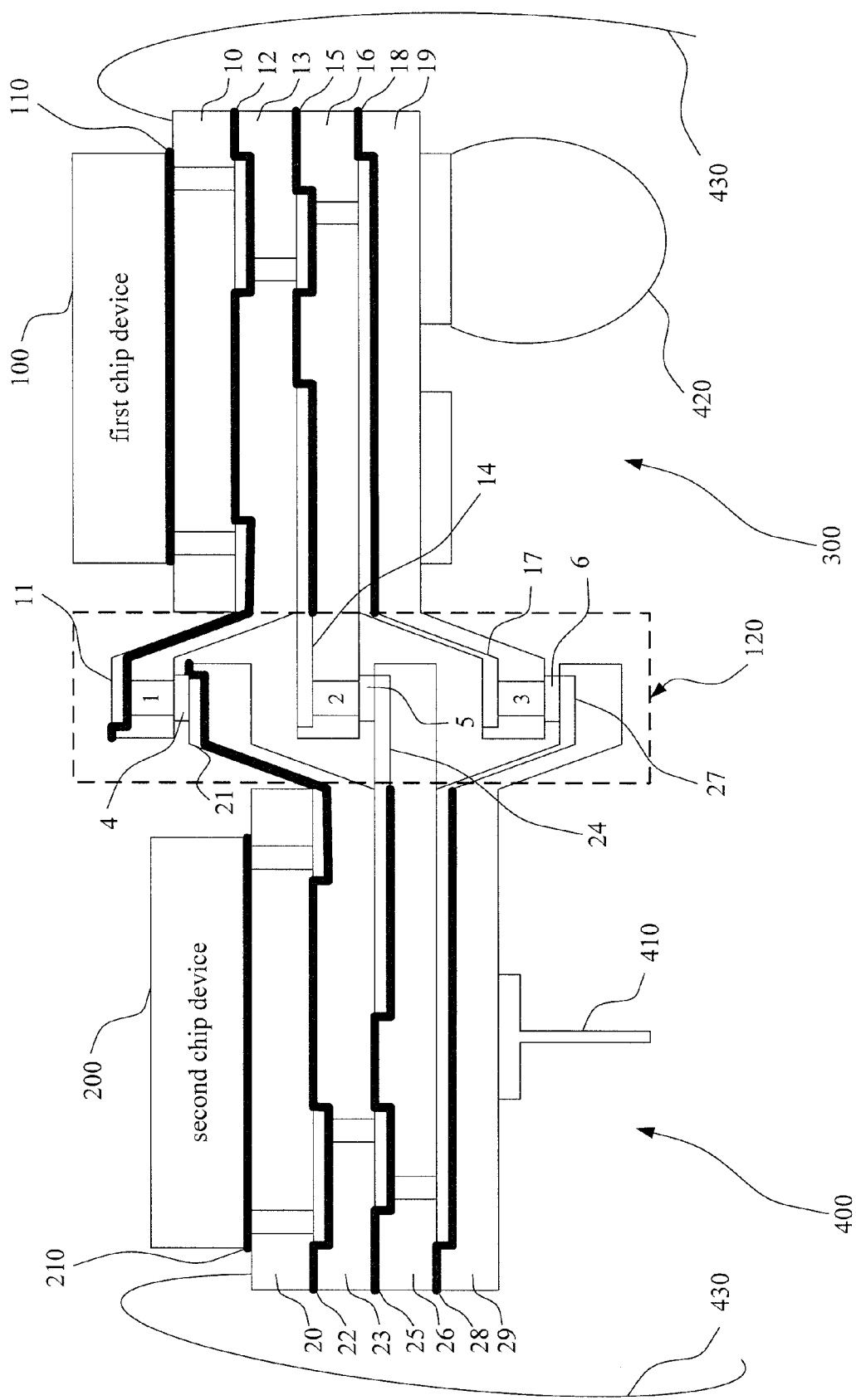
FIG. 2 illustrates a profile drawing of a hybrid structure of multi-layer substrates according to a first embodiment of the present invention wherein the interface adhesion enhancing process implementing areas are indicated with bold lines.

Please refer to FIG. 2, which illustrates a profile drawing of a hybrid structure of multi-layer substrates according to a first embodiment of the present invention wherein the interface adhesion enhancing process implementing areas are indicated with bold lines. An interface adhesion enhancing process can be implemented between the first chip device 100 and the first multi-layer substrate 300, or between the second chip device 200 and the second multi-layer substrate 400 to increase adhesion intensities between the first chip device 100, the second chip device 200 and the first outer surfaces of the first multi-layer substrate 300 and the second multi-layer substrate 400 (the adhesion intensity between dielectric layer and silicon). Moreover, an interface adhesion enhancing process is also implemented on rest surfaces of the first metal layers, the second metal layers, the first dielectric layers and the second dielectric layers except the separated border districts to increase adhesion intensity on the aforesaid rest surfaces. Significantly, an interface adhesion enhancing process is not implemented on the border districts between the first dielectric layer 13 and the first metal layer 14, between the first dielectric layer 16 and the first metal layer 17, between the first dielectric layer 16 and the first metal layer 17, between the second dielectric layer 23 and the second metal layer 24 or between the second dielectric layer 26 and the second metal layer 27. Alternatively, an interface adhesion weakening process can be implemented between those border district. Because the interface adhesion enhancing process is implemented on the rest surfaces except the border districts between the dielectric layers, the border districts which are not implemented with the interface adhesion enhancing process or implemented with the interface adhesion weakening process can be easily separated from the other adjacent border districts of layers.

The way to separate the border districts of the multi-layer substrates can be using two adhesive tapes (such as UV tape) to stick on the first outer surface and the second outer surface of the first multi-layer substrate 300 or the second multi-layer substrate 400, first; and then, rending the two tapes to separate the border districts which are not implemented with the interface adhesion enhancing process. Repeating the sticking and rending procedures, the border districts of the layers which are not implemented with the interface adhesion enhancing process can be separated. However, the metal layers 11, 14, 17, 21, 24, 27 are connected with the dielectric layers 13, 16, 19, 23, 26, 29. With a concept of selective interface adhesion enhancing process between the dielectric layers, the hybrid structure of the first multi-layer substrate 300 and the second multi-layer substrate 400 can be accomplished. For example, material of the dielectric layers is polyimide; the aforesaid interface adhesion enhancing process can be an oxygen or argon plasma process.

As aforementioned, the third substrate can be use to connect the first outer surface of the first multi-layer substrate 300 or the first outer surface of the second multi-layer substrate 400. The connect method can be BGA package, LGA package, PGA package or Wire Bond Package. In a case that the first multi-layer substrate 300, the second multi-layer substrate 400 and the third substrate are all flexible multi-layer interconnection substrates, the hybrid structure of the multi-layer substrates of the present invention can provide a flexible package for those aforesaid flexible multi-layer interconnection substrates.

Figure 3A:
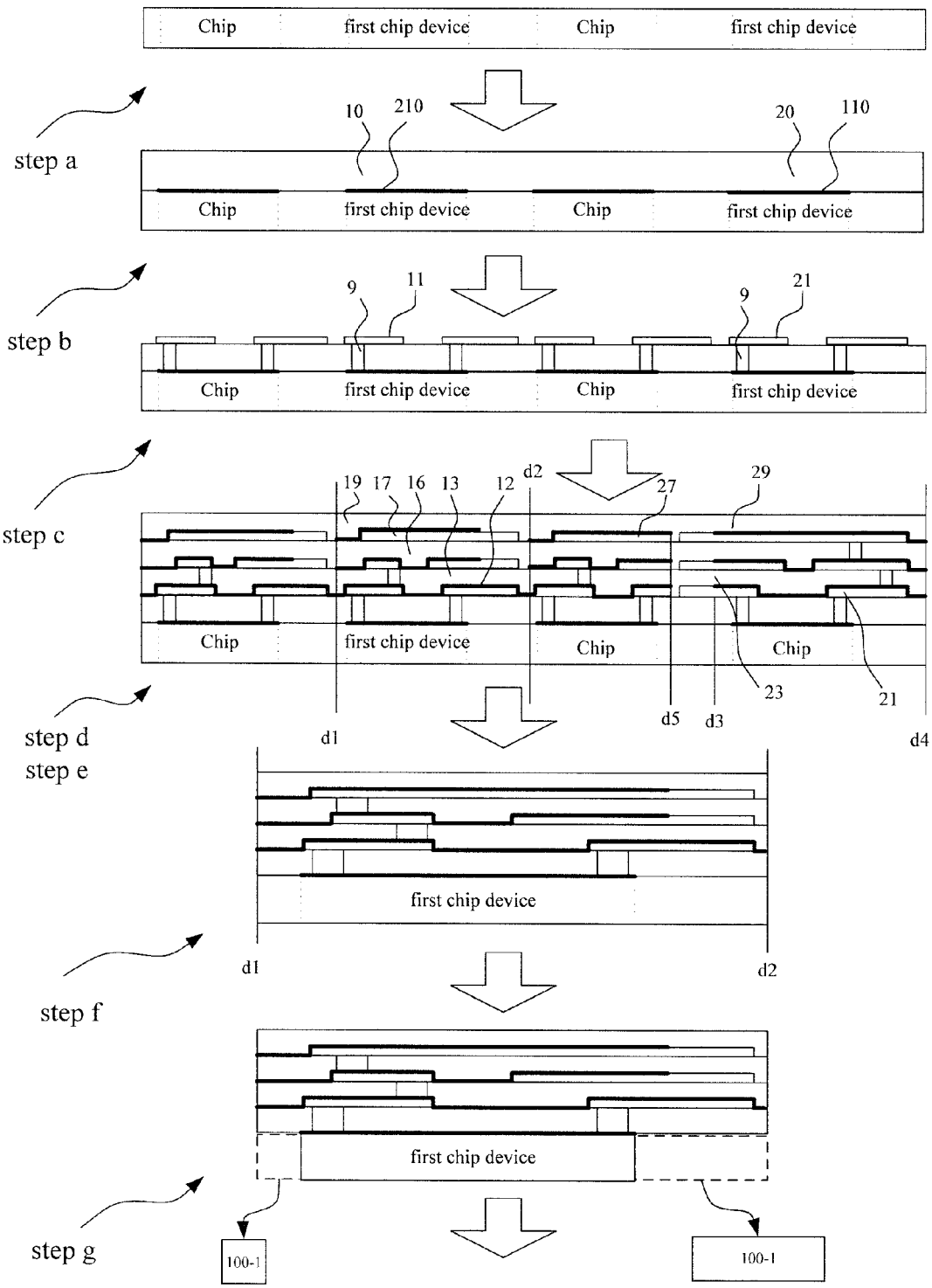
FIG. 3A and FIG. 3B illustrate a flowchart of a manufacture method of the hybrid structure of multi-layer substrates according to the present invention.
Figure 3B:
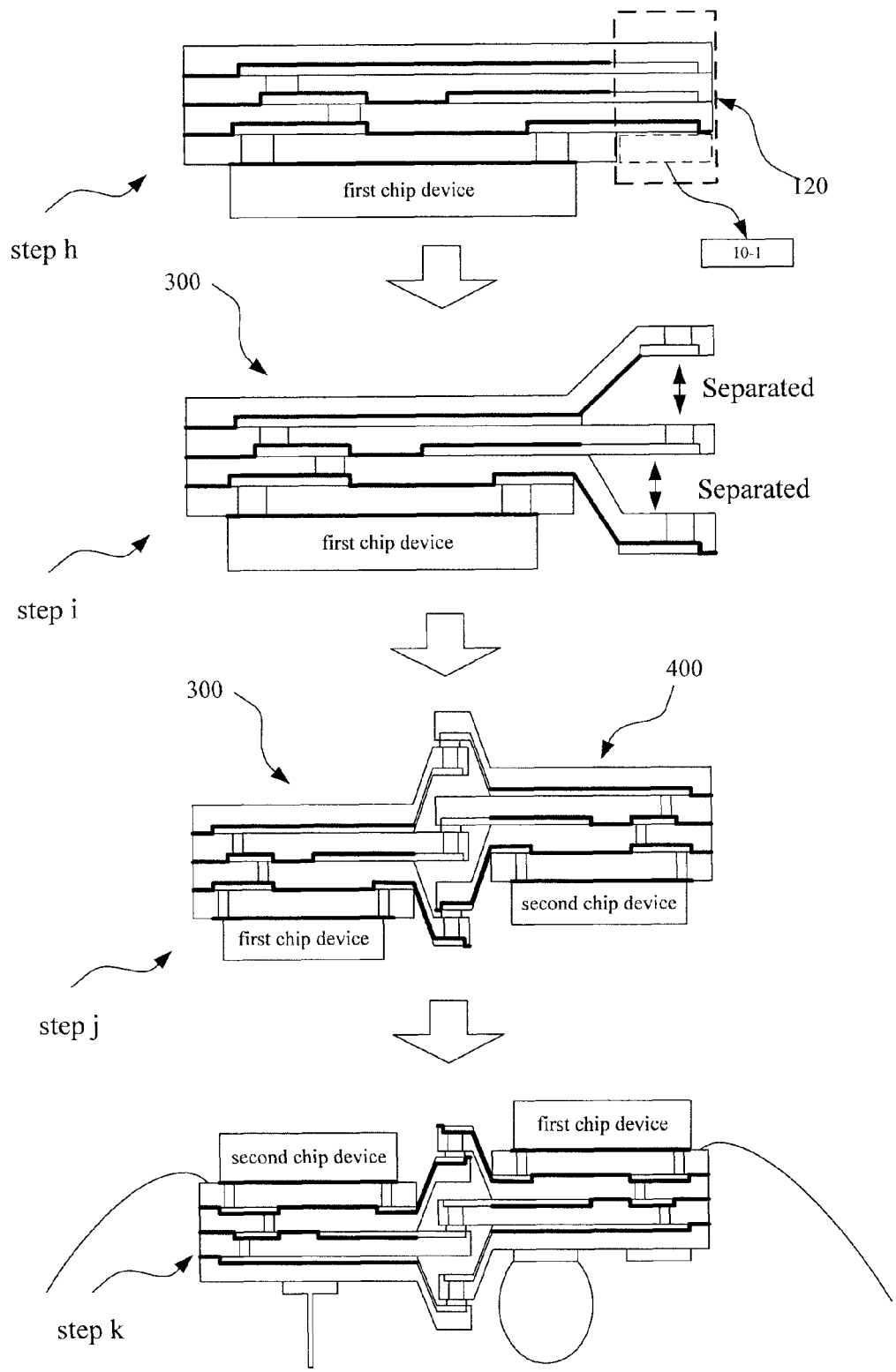

Please refer to FIG. 3A and FIG. 3B which illustrate a flowchart of a manufacture method of the hybrid structure of multi-layer substrates according to the present invention. The manufacture method of the present invention comprises steps of:

Step a. providing a device wafer including a plurality of chip devices;

Step b. implementing an interface adhesion enhancing process 110, 210 on the chip devices to increase adhesion intensity on surfaces of the first chip devices and then coating dielectric layers 10, 20;

Step c. forming a plurality of VIAs at predetermined positions 9 and metal layers 11, 21 on the dielectric layer at predetermined areas of the metal layers;

Step d. coating another dielectric layers 13, 23;

Step e. repeating the step c and the step d to form the multi-layer substrates;

Step f. dividing the chip devices and corresponding multi-layer substrates along edges of the border districts (vertical lines, d2, d3 shown in Figures for Step d. and Step e.);

Step g. removing parts 100-1 of the device wafer without chip devices;

Step h. removing a border district 10-1 of the dielectric layer 10 adjacent to the chip device 100 to reveal a border district of the corresponding metal layer 11 of the dielectric layer 10 by using laser or separating dielectric layer;

Step i. separating a border district of at least one metal layer connecting with a border district of the corresponding dielectric layer from adjacent metal layers and adjacent dielectric layers for each multi-layer substrate;

Step j. connecting electric conductor in a VIA of a first metal layer of the first multi-layer substrate 300 with a separated border district of a metal layer of the second multi-layer substrate 400 by using tin finish bonding, Eutectic bonding, Anisotropic Conductive Film bonding, Gold-Gold bonding or Gold-Copper bonding to complete the hybrid structure of multi-layer substrates; and Step k. connecting the second outer surfaces of the first multi-layer substrate 300 and the second multi-layer substrate 400 with a third substrate (not shown in FIG. 3B). As aforementioned, the connecting method can be BGA package, LGA package, PGA package or Wire Bond Package. Although the manufacture method of the first multi-layer substrate 300 is illustrated in FIG. 3A and FIG. 3B, the manufacture method of the second multi-layer substrate 400 or the third substrate is similar thereto.

Alternatively, the present invention can also provide a carrier (including no chip devices) instead of the device wafer. Accordingly, the step f. of dividing chip the devices can be omitted and the whole carrier will be removed during the step g. Then, first and the second chip devices may be connected to the first and second multi-layer substrates 300, 400 in the step j. or other steps.

The manufacture method of the present invention may further comprises a step of implementing an interface adhesion enhancing process 12, 22 on rest surface of the dielectric layer 10, 20 and the metal layer 11, 21 except a border district thereof to increase adhesion intensity on the rest surface before coating the another dielectric layer 13, 23 during the step d. Alternatively, the aforesaid step can be replaced by a step of implementing an interface adhesion weakening process on the border districts to decrease adhesion intensity thereon.

Figure 4:
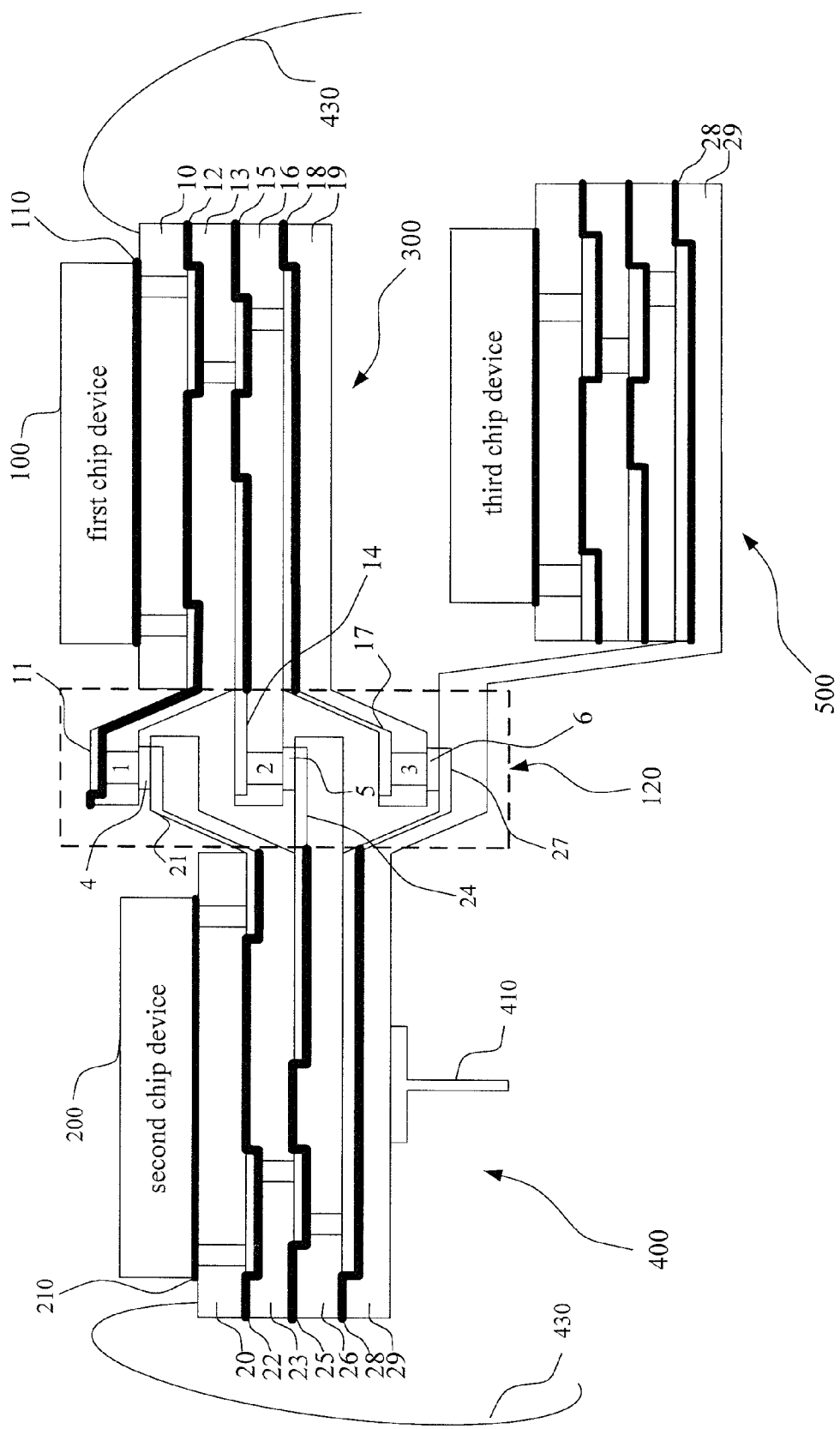
FIG. 4 illustrates profile drawing of a hybrid structure of multi-layer substrates according to a second embodiment of the present invention wherein the connection of one second metal layer and the corresponding second dielectric layer is retained as dividing the second multi-layer substrate and the third multi-layer substrate.

Please refer to FIG. 4, which illustrates profile drawing of a hybrid structure of multi-layer substrates according to a second embodiment of the present invention wherein the connection of a second metal layer 27 and the corresponding second dielectric layer 29 is retained as dividing the second multi-layer substrate and the third multi-layer substrate.

Please also refer to the figures for Step d. and Step e. shown in FIG. 3A about the manufacture method of the first multi-layer substrate 300 according to the present invention. The manufacture method of the second multi-layer substrate 400 is similar to thereto. Supposing that the second chip device 200 and the second multi-layer substrate 400 are between the vertical lines d3, d4; a third chip device and the third multi-layer substrate 500 are between the vertical lines d2, d3, the difference in Step f. from the first embodiment is dividing the chip devices and corresponding multi-layer substrates along the vertical lines d2, d4 completely but dividing along the vertical line d5 from the chip device stops at second metal layer 27 and the dielectric 29; dividing along the vertical line d3 from the chip device stops at second metal layer 21 and the dielectric 23. Then, the second metal layers and the second dielectric layers between the vertical lines d3, d5 are separated. Accordingly, the second multi-layer substrate 400 and the third multi-layer substrate 500 own the second metal layer 27 and the dielectric 29 together. Similarly as described in the first embodiment, the hybrid structure of the first multi-layer substrate 300 and the second multi-layer substrate 400 remains. Therefore, the present invention provides a concept having more possibilities of multiple interconnections for multi-layer substrates.

In conclusion, the present invention provides a hybrid structure of multi-layer substrates and manufacture method thereof to connect different kinds of chip devices directly through the hybrid structure of the respective multi-layer substrates connecting the chip devices therewith and without a shared substrate. The hybrid structure of multi-layer substrates according to the present invention can reduce the package volume of the whole system for increasing the package integration and further provide a flexible package for application of a flexible electronic system. Comparing to prior arts, the present invention has high integration and high package integration of System-In-Package either for the package among chip devices or for package among multi-layer substrates.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A hybrid structure of multi-layer substrates, the hybrid structure comprising:
    a first multi-layer substrate, stacking up a plurality of first metal layers, a plurality of first dielectric layers alternately and having a plurality of VIAs, wherein a border district of at least one first metal layer connects with a border district of the corresponding first dielectric layer and the border districts are separated from adjacent first metal layers and adjacent first dielectric layers; and
    a second multi-layer substrate, stacking up a plurality of second metal layers and a plurality of second dielectric layers alternately, wherein a border district of at least one second metal layer connects with a border district of the corresponding second dielectric layer of the second metal layer and the border districts are separated from adjacent second metal layers and adjacent second dielectric layers, and wherein the VIAs are located at the border districts of the first dielectric layers and each VIA has electric conductor therein to connect at least one first metal layer with at least one second metal layer to form a connection section;
    wherein the first multi-layer substrate and the second multi-layer substrate are flexible multi-layer interconnection substrates and the connection section is also flexible.

2. The hybrid structure of claim 1, wherein an interface adhesion enhancing process is implemented on rest surfaces of the first metal layers and the corresponding first dielectric layers except the border districts thereof to increase adhesion intensity on the rest surfaces.

3. The hybrid structure of claim 1, wherein the material of the first dielectric layers is polyimide.

4. The hybrid structure of claim 1, wherein an interface adhesion enhancing process is implemented on rest surfaces of the second metal layers and the corresponding second dielectric layers except the border districts thereof to increase adhesion intensity on the rest surfaces.

5. The hybrid structure of claim 1, wherein the material of the second dielectric layers is polyimide.

6. The hybrid structure of claim 1, further comprising a first chip device positioned on a first outer surface of the first multi-layer substrate.

7. The hybrid structure of claim 6, wherein the first chip device is selected from a logic circuit component, a memory, an analog component, an optoelectronic component, a microelectric mechanic component and a luminous component.

8. The hybrid structure of claim 6, wherein an interface adhesion enhancing process is implemented on the first chip device to increase adhesion intensity between the first outer surface and the first chip device.

9. The hybrid structure of claim 6, further comprising a third substrate to connect the first chip device.

10. The hybrid structure of claim 1, further comprising a second chip device positioned on a first outer surface of the second multi-layer substrate.

11. The hybrid structure of claim 10, wherein the second chip device is selected from a logic circuit component, a memory, an analog component, an optoelectronic component, a microelectric mechanic component and a luminous component.

12. The hybrid structure of claim 10, wherein an interface adhesion enhancing process is implemented on the second chip device to increase adhesion intensity between the first outer surface and the second chip device.

13. The hybrid structure of claim 10, further comprising a third substrate to connect the second chip device.

14. The hybrid structure of claim 1, further comprising a third substrate to connect the first chip device or the second chip device.

15. The hybrid structure of claim 14, wherein the third substrate is a flexible substrate.

* * * * *